United States Patent
Culetu et al.

(10) Patent No.: US 6,463,574 B1
(45) Date of Patent: Oct. 8, 2002

(54) APPARATUS AND METHOD FOR INSERTING REPEATERS INTO A COMPLEX INTEGRATED CIRCUIT

(75) Inventors: Julian Culetu, Redwood City; Chaim Amir, Sunnyvale, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/329,552

(22) Filed: Jun. 10, 1999

Related U.S. Application Data

(60) Provisional application No. 60/089,156, filed on Jun. 12, 1998.

(51) Int. Cl.[7] .............................................. G06F 17/50
(52) U.S. Cl. ................... 716/8; 716/9; 716/10; 716/11
(58) Field of Search ................... 716/1–18; 714/731; 708/207; 703/13, 19, 23

(56) References Cited

U.S. PATENT DOCUMENTS

| | | | | |
|---|---|---|---|---|
| 5,638,291 A | * | 6/1997 | Li et al. | 716/18 |
| 5,798,935 A | * | 8/1998 | Doreswamy et al. | 716/6 |
| 6,253,359 B1 | * | 6/2001 | Cano et al. | 716/6 |

* cited by examiner

Primary Examiner—Matthew Smith
Assistant Examiner—Naum Levin
(74) Attorney, Agent, or Firm—Pennie & Edmonds LLP

(57) ABSTRACT

A method of inserting repeaters into a complex integrated circuit includes the step of selecting, based upon signal transition data, a maximum wire length to be positioned between two repeaters in a complex integrated circuit. The maximum wire length is then correlated with a signal transition-based ratio coefficient defining the relation between a signal transition time and a Resistive-Capacitive delay. A signal transition-based Resistive-Capacitive delay is then defined based upon the signal transition-based ratio coefficient. A repeater distribution is then mapped within the complex integrated circuit based upon the signal transition-based Resistive-Capacitive delay.

12 Claims, 11 Drawing Sheets wire1: Rw1 = R1; Cw1 = C1 + R1/Rt * C2; Rt = R1 + R2;
wire2: Rw2 = R2; Cw2 = R2/Rt1 * C2 + R2/Rt2 * C3; Rt1 = R1 + R2; Rt2 = R2 + R3 + R5;

APPARATUS AND METHOD FOR INSERTING REPEATERS INTO A COMPLEX INTEGRATED CIRCUIT

This application claims priority to the provisional patent application entitled: "Practical Repeater Insertion Method Using Elmore Delay in High Speed VLSI Circuits", Ser. No. 60/089,156, filed Jun. 12, 1998.

BRIEF DESCRIPTION OF THE INVENTION

This invention relates generally to the design of complex integrated circuits. More particularly, this invention relates to a technique for selecting an optimal distance between repeaters in a complex integrated circuit, and subsequently inserting repeaters into the complex integrated circuit based upon this optimal distance.

BACKGROUND OF THE INVENTION

Complex integrated circuits, such as Very Large Scale Integrated (VLSI) circuits, include relatively long signal paths. Signal repeaters are used in such circuits to mitigate the effect of signal propagation delays along these long signal paths. That is, after the layout of a complex integrated circuit is defined, repeater are inserted into the circuit to mitigate the effect of signal propagation delays along long signal paths.

Signal propagation over the on chip metal interconnect is significant due to Resistive-Capacitive (RC) delay. In general, the interconnect delay increases with the square of the length of the line. Delay is reduced through the use of repeaters, which are typically implemented as inverter or non-inverting buffers. There are certain objectives when inserting repeaters into a complex circuit. These objectives include the minimization of interconnect delay, limiting transition times, minimizing die area, and minimizing power consumption.

Standard practice is to analyze the interconnect network using rules-of-thumb, inserting repeaters in a simulated netlist model of the circuit (e.g., a SPICE simulated netlist model), and then simulating the network to analyze the solution. An observed general rule is to space repeaters evenly at intervals less than some maximum distance, which is determined through simulation. This general rule does not take into consideration networks with more than one receiver or branches or the effects of the receiver input capacitance or driver strength variations, thus additional analysis is needed to determine the optimum repeater location for specific networks. This procedure is repeated until a satisfactory solution is found which minimizes the interconnect delay and/or transition times. In a large scale microprocessor, the number of interconnect networks requiring this type of analysis is very large and would therefore require significant time and resources to complete.

A Resistive-Capacitive delay or Elmore delay is described in P. Penfield and J. Rubinstein, "Signal Delay in RC Tree Networks", in *Proc. 18th Design Automation Conf.*, 1981, pp-613–617. The Elmore delay is an efficient way of calculating the delay for an RC tree. A first order approximation of RC delay at any node i on an RC tree is given by the Elmore time constant:

$$T_i = \sum_{k=1}^{n} R_{ki} C_i \quad \text{(Equation 1)}$$

where $R_{ki}$ is the resistance of the portion of the (unique) path between the input and node i, which is common with the (unique) path between the input and node k, and Ck is the capacitance at node k.

The first order approximation of the waveform at node i is $$V^i(t) = V_{DD}(1 - e^{-t/T_i}) \quad \text{(Equation 2)}$$

where Ti is the time constant Elmore delay given by Equation 1. The time at which the voltage at node i reaches any value $V_x$ is determined by $$T_x = T_i \ln \frac{V_{DD}}{V_{DD} - V_x} \quad \text{(Equation 3)}$$

A quick approximation of 20–80% (or 10–90%) transition time can be calculated by substituting Vx with voltages at 20 and 80% of $V_{DD}$ $$T_1 \approx 0.72 \cdot T_{20\text{-}80} \quad \text{(Equation 4)}$$

The ratio coefficient of the transition time (20–80%) based on first order approximation is about 1.39 (i.e., 1/0.72).

The ratio coefficient based upon a first order approximation is not accurate enough for many repeater insertion methodologies. The reason for this is that the optimum distance between repeaters, and the size of the repeater itself that will satisfy design requirements are determined by running circuit simulations (e.g., SPICE simulations). The circuit simulations have at least some inherent inaccuracies. Accordingly, it would be highly desirable to identify a technique that minimizes the impact of circuit simulation inaccuracies, while simultaneously exploiting Elmore delay information. Such a technique could then be used for positioning repeaters in a complex integrated circuit.

SUMMARY OF THE INVENTION

A method of inserting repeaters into a complex integrated circuit includes the step of selecting, based upon signal transition data, a maximum wire length to be positioned between two repeaters in a complex integrated circuit. The maximum wire length is then correlated with a signal transition-based ratio coefficient defining the relation between a signal transition time and a Resistive-Capacitive delay. A signal transition-based Resistive-Capacitive delay is then defined based upon the signal transition-based ratio coefficient. A repeater distribution is then mapped within the complex integrated circuit based upon the signal transition-based Resistive-Capacitive delay.

The apparatus of the invention is a computer readable memory to direct a computer to function in a specified manner. The computer readable memory includes a wire length identification module to select, based upon signal transition data, a maximum wire length to be positioned between two repeaters in a complex integrated circuit. A ratio coefficient selection module correlates the maximum wire length with a signal transition-based ratio coefficient defining the relation between a signal transition time and a Resistive-Capacitive delay. A delay calculation module defines a signal transition-based Resistive-Capacitive delay based upon the signal transition-based ratio coefficient. A repeater insertion module maps a repeater distribution within the complex integrated circuit based upon the signal transition-based Resistive-Capacitive delay.

The invention uses an improved Resistive-Capacitive delay value that is based upon signal transition time information. The signal transition time information is incorporated into the Resistive-Capacitive delay value via the signal transition-based ratio coefficient. The more accurate Resistive-Capacitive value utilized in accordance with the invention results in the use of fewer repeaters. Accordingly, die size and power consumption is reduced.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
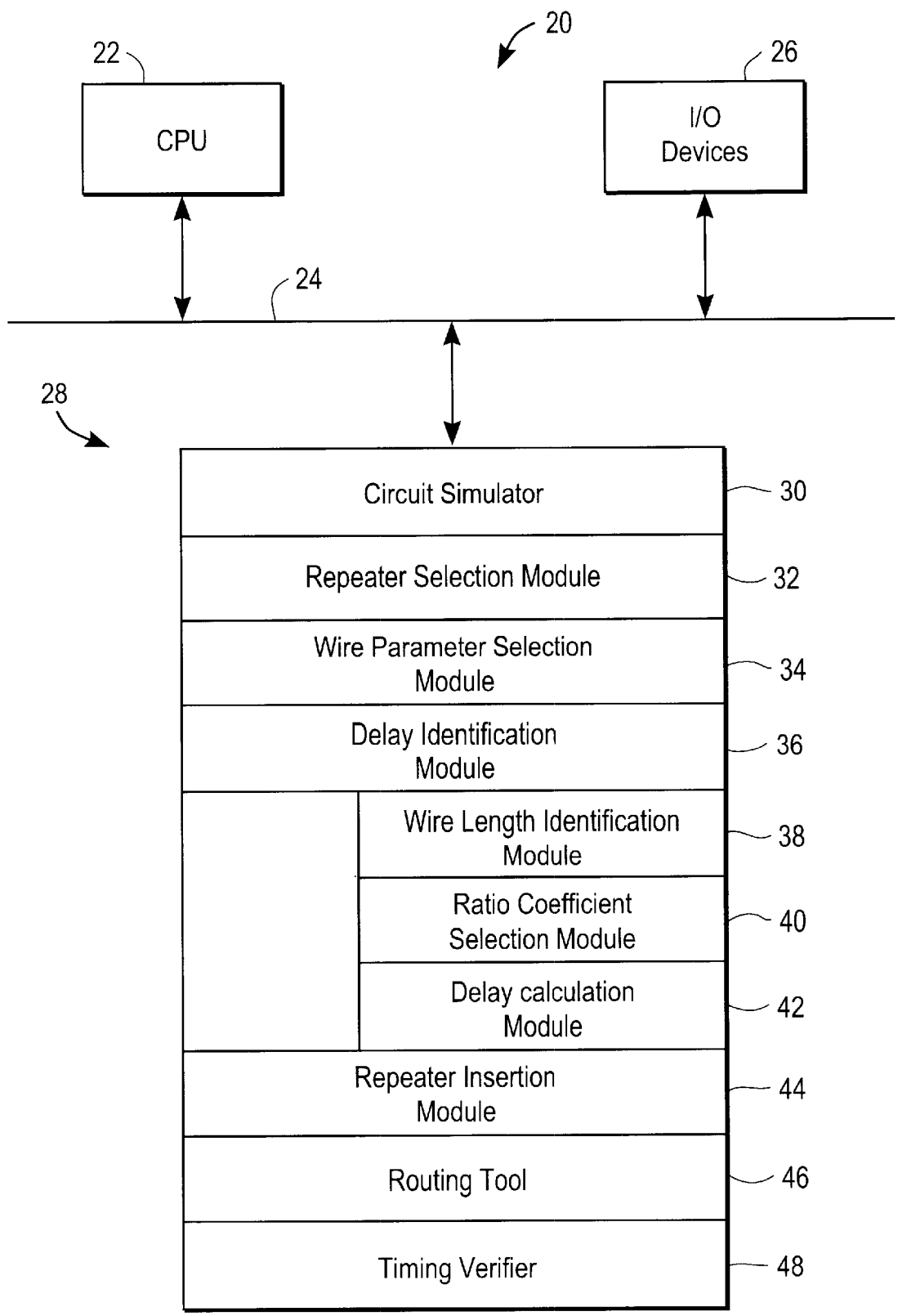
FIG. 1 illustrates an apparatus that may be used to practice the method of the invention.

FIG. 1 illustrates an apparatus 20 that may be used to practice the methodology of the invention. The apparatus 20 includes a central processing unit 22. The central processing unit 22 is connected via a system bus 24 to a set of input/output devices 26, which may include standard devices, such as a keyboard, mouse, video monitor, printer, and the like. A memory 28 is also connected to the system bus 24. The components 22, 24, 26, and 28 are well known components that form a computer 20. The invention is directed toward particular executable programs that operate on the computer 20.

Preferably, the computer 20 includes the following executable programs in its memory 28: a circuit simulator 30, a repeater selection module 32, a wire parameter selection module 34, and a delay identification module 36, which may be implemented to include a wire length identification module 38, a ratio coefficient selection module 40, and a delay calculation module 42. In an embodiment of the invention the memory also includes: a repeater insertion module 44, a routing tool 46, and a timing verifier 48.

The circuit simulator 30 may be a SPICE simulator or similar simulator known to those skilled in the art. The circuit simulator 30 is used to acquire performance data for a circuit. Thereafter, the performance data is used to select a wire length and a ratio coefficient that is used to determine an Elmore delay, as discussed below.

The repeater selection module 32 is used to select a repeater design for the complex integrated circuit based upon preselected design requirements. The preselected design requirements may include such factors as propagation delay, wire width, and power dissipation. The wire parameter selection module 34 is used to select wire parameters for the complex integrated circuit based upon preselected design requirements. The preselected design requirements may include such factors as propagation delay, wire width, and power dissipation.

The delay identification module of the invention 36 is used to a define a signal transition-based Resistive-Capacitive delay. In the prior art, maximum Elmore delays were defined. However, the maximum Elmore delays selected in the prior art were based upon calculated Elmore delays that used a set ratio coefficient. In contrast, the present invention selects a signal transition-based ratio coefficient based upon design and performance parameters associated with the circuit. The signal transition-based ratio coefficient is then used to define a signal transition-based Resistive-Capacitive delay, which is an improved Elmore delay value.

As shown in FIG. 1, the delay identification module 36 may be implemented with a wire length identification module 38. In one embodiment, the wire length identification module 38 selects a wire length based upon a data set comparing signal propagation delay and wire length. In addition, the wire length identification module 38 relies upon signal transition data, as discussed below.

The delay identification module 36 also includes a ratio coefficient selection module 40, which is used to select a signal-transition based ratio coefficient based upon a data set comparing ratio coefficients with performance data for different wire lengths.

The delay calculation module 42 of the delay identification module 36 uses the identified signal-transition based ratio coefficient from the ratio coefficient selection module 40 to establish a signal transition-based Resistive-Capacitive delay.

Once the signal transition-based Resistive-Capacitive delay is defined, the value can be used for placement of repeaters in the complex integrated circuit. The value identified in accordance with the invention may be used with a prior art repeater insertion methodology. FIG. 1 illustrates a repeater insertion module 44 that may be used for this purpose. After the repeaters are positioned within the complex integrated circuit, a routing tool 46 may be used to re-route the complex integrated circuit. Thereafter, a timing verifier 48 may be used to confirm that the complex integrated circuit operates in accordance with timing parameters. The repeater insertion module 44, routing tool 46, and timing verifier 48 may be used repetitively, if necessary, to obtain desired performance results.

The operation of the invention has been described in connection with FIG. 1. The operation of the invention is more fully appreciated with reference to following discussion which expands upon the discussion in connection with FIG. 1.

The circuit simulator 30 has been implemented as a SPICE simulator. As demonstrated below, the output from the circuit simulator 30 is used to select a signal transition-based ratio coefficient.

The repeater selection module 32 and wire parameter selection module 34 respectively identify repeater parameters and wire parameters based upon preselected design requirements, such as propagation delay, wire width, and power dissipation. The circuit simulator 30 simulates circuit performance for a circuit that includes the repeater parameters and wire parameters specified by the repeater selection module and the wire parameter selection module.

Figure 2:
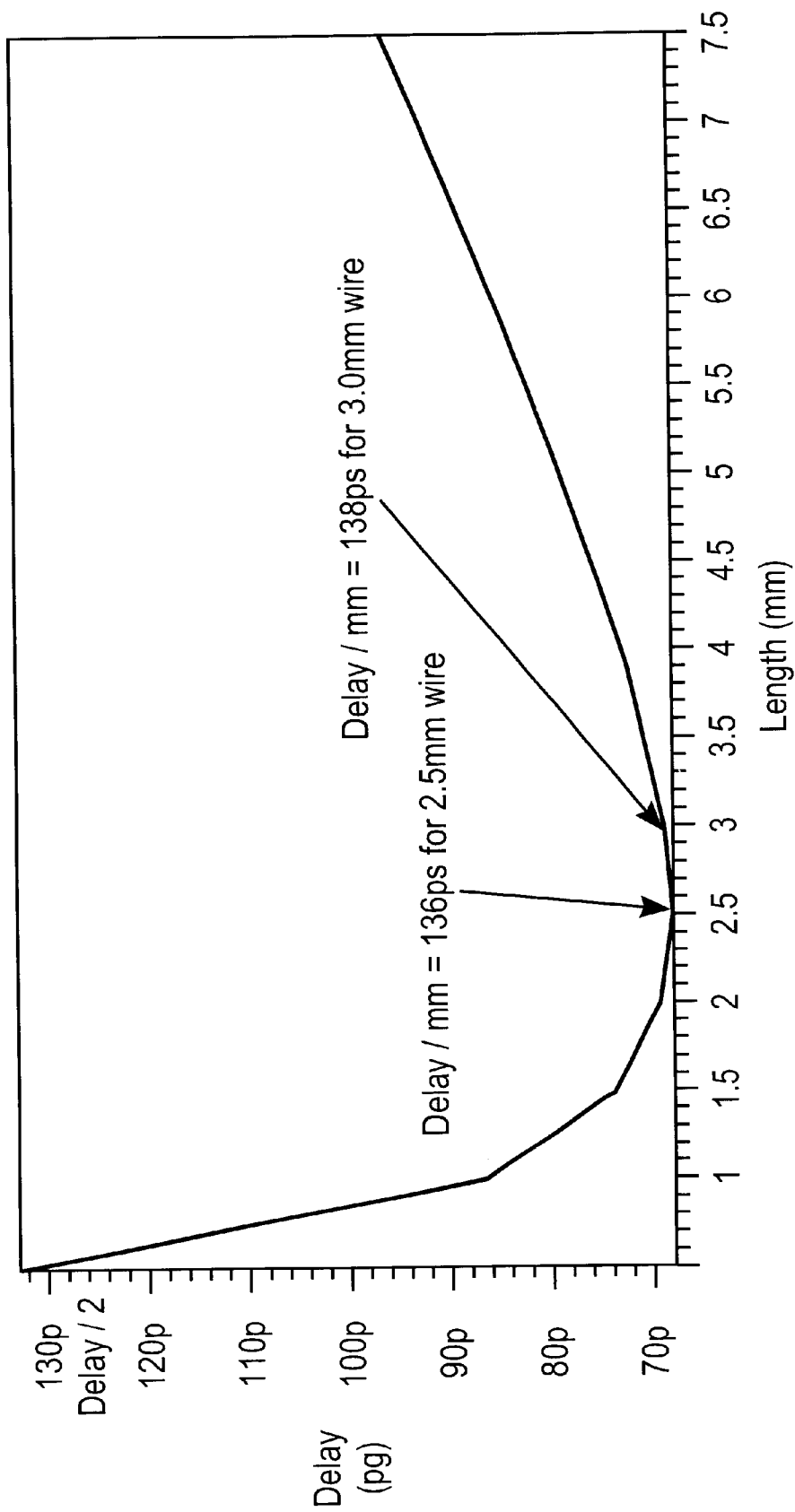
FIG. 2 is an example of data that may be used in accordance with an embodiment of the invention to select a maximum wire length between repeaters.

As previously indicated, the delay identification module 36 includes a wire length identification module 38. This module processes information of the type shown in FIG. 2. FIG. 2 illustrates results from the circuit simulator 30 that show signal propagation delay as a function of wire length for a predetermined wire width. The wire length identification module 38 processes information of the type shown in FIG. 2 and recognizes that, in this example, the delay per mm does not change much from 2.5 mm to 3.0 mm. Since it is desirable to insert as few repeaters as possible while still maintaining an optimal delay, a length of 3.0 mm is more desirable than 2.5 mm in this example.

Figure 3:
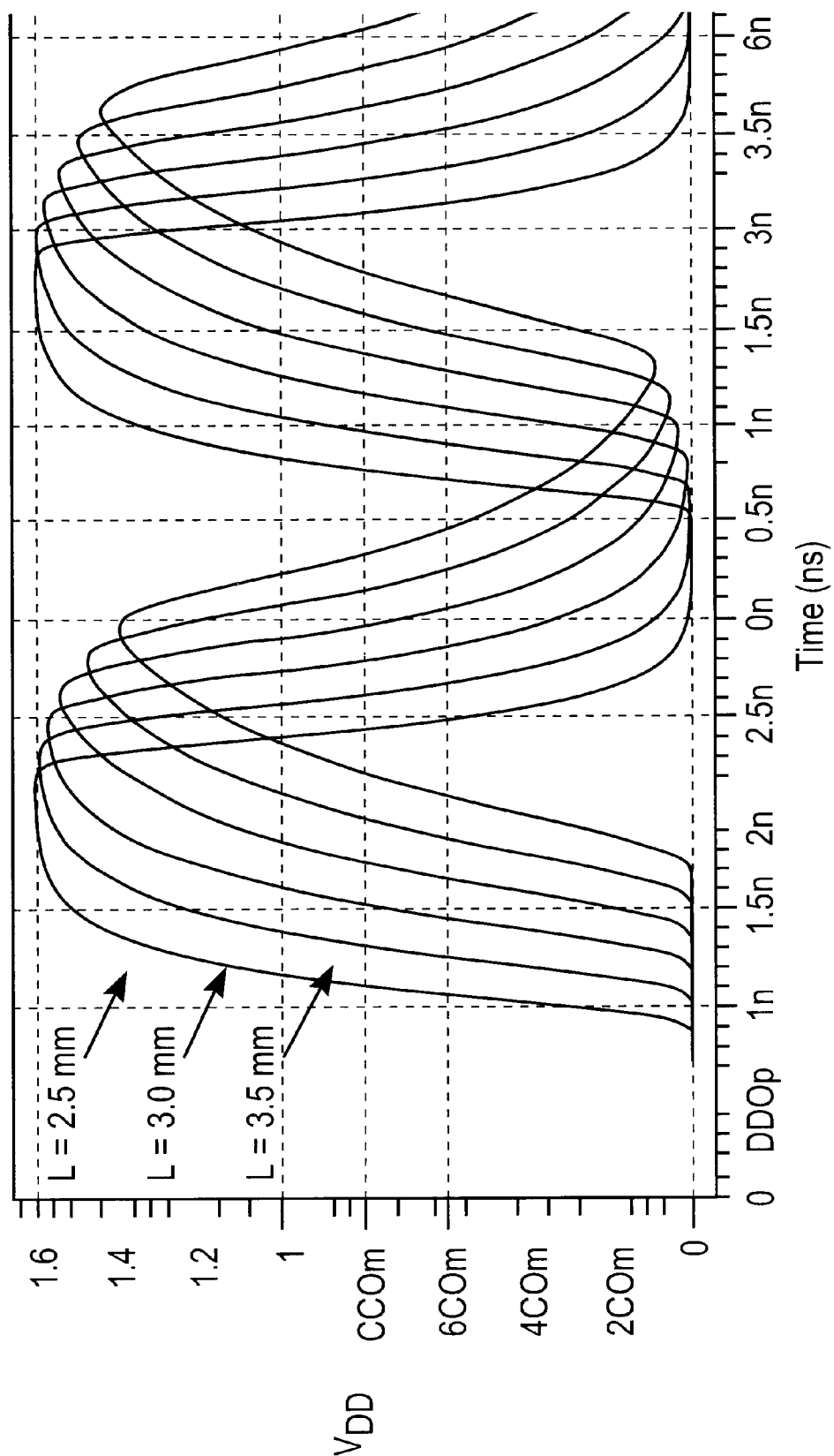
FIG. 3 is an example of transition time data that may be used in accordance with an embodiment of the invention to select a maximum wire length between repeaters.

In addition to the data of FIG. 2, the wire length identification module 38 considers transition time data of the type shown in FIG. 3. FIG. 3 illustrates signal transition waveforms for various lengths between repeaters. This data was also generated by the circuit simulator 30. A length of 3.0 mm produces a signal transition to a $V_{DD}$ signal level in a satisfactory period of time, whereas a length of 3.5 mm results in an appreciably larger time delay before a $V_{DD}$ signal level is reached. Thus, the wire length identification module 38 considers wire length limiting factors attributable to RC degradation, as shown in FIG. 3.

In view of the foregoing considerations, in this case, the wire length identification module 38 designates the wire length at 3.0 mm. Observe that this maximum wire length is selected in view of signal transition data (e.g., the signal transition data shown in FIG. 3). The relatively long wire length selected for insertion between repeaters translates into fewer repeaters, resulting in reduced die area and power consumption.

Figure 4:
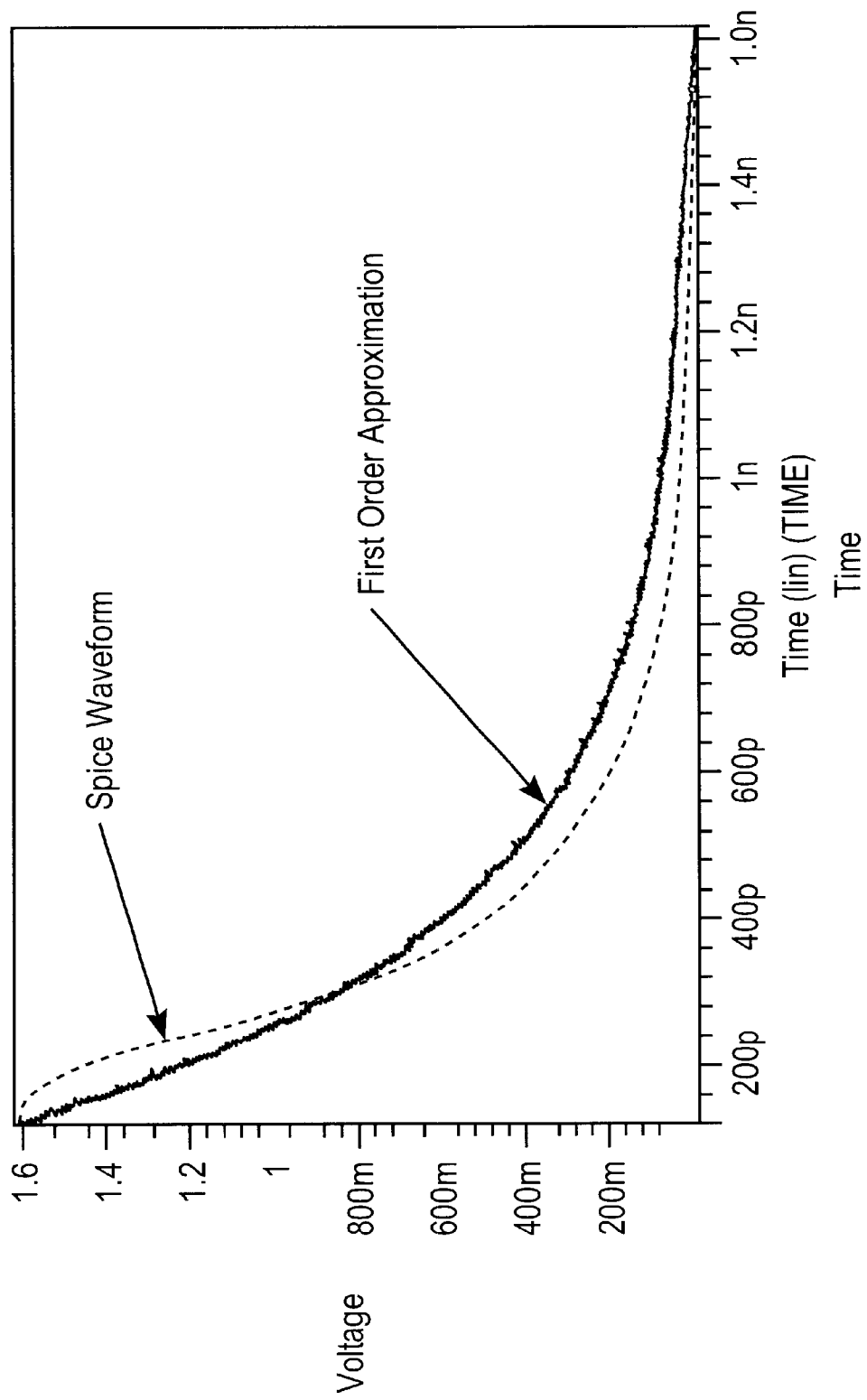
FIG. 4 is an example comparing a first order approximation of a waveform to a simulated waveform.

A simulated voltage waveform corresponding to a 3.0 mm distance between repeaters is captured and shown in FIG. 4. FIG. 4 also illustrates the corresponding first order approximation overlapped on the same plot. As can be observed, the waveforms almost match at 50% of $V_{DD}$, but not at 20% of $V_{DD}$ and 80% of $V_{DD}$.

The transition time information analyzed up to this point cannot be used to map repeaters into an integrated circuit. The present invention overcomes this inability to directly utilize the transition time information by converting the transition time information into Elmore delay information that can be used for repeater insertion. This conversion of transition time information into Elmore delay information is accomplished as follows.

Figure 5:
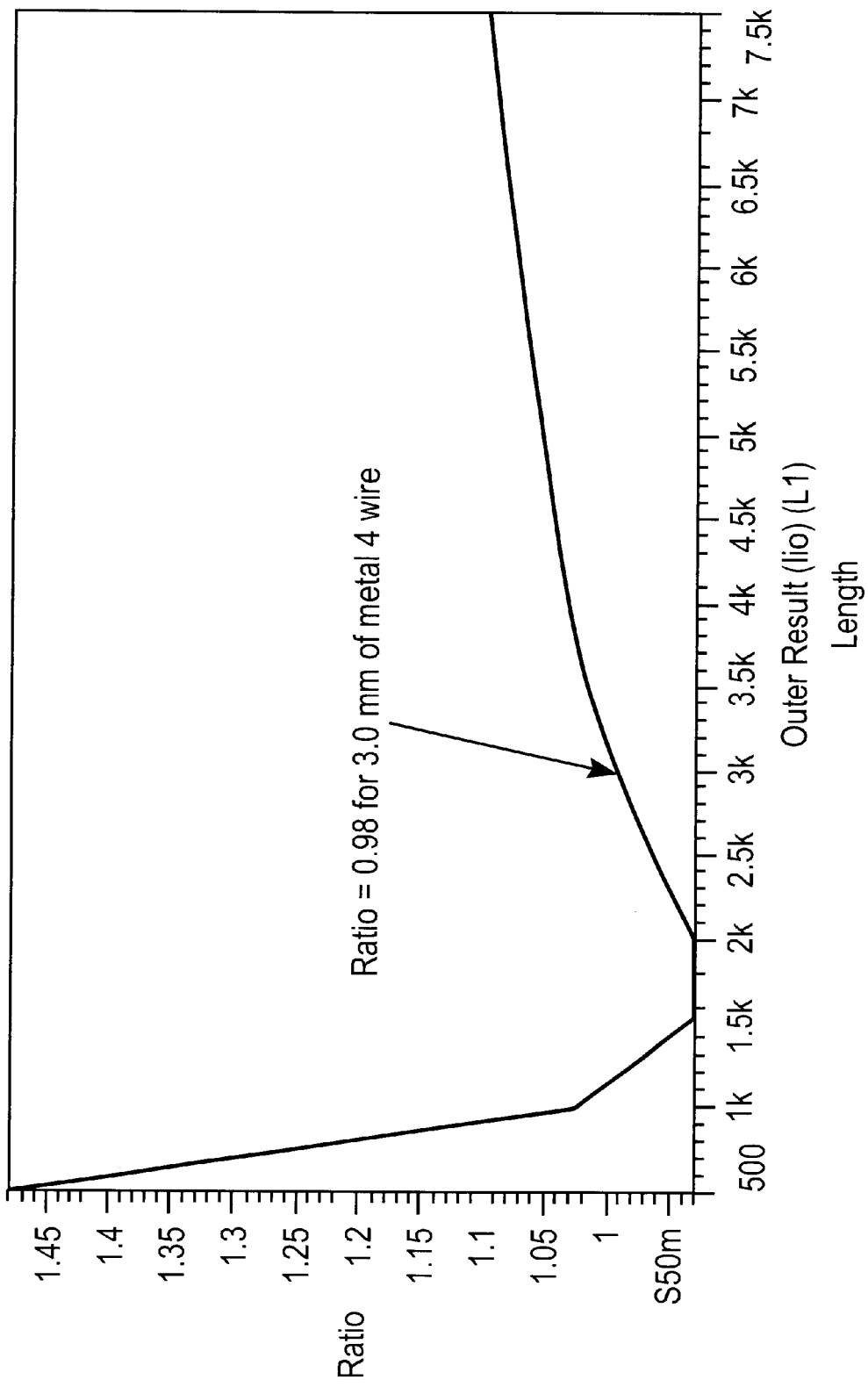
FIG. 5 is an example of a plot that may be used in accordance with an embodiment of the invention to select a ratio coefficient defining the relation between a transition time and an Elmore delay.

To get the Elmore time constant that corresponds to the transition time at the load, a ratio of the Elmore (Resistive-Capacitive) delay and transition time is plotted with respect to the wire length, as shown in FIG. 5. The ratio coefficient for a length of wire 3.0 mm long is 0.98. The ratio coefficient selection module 40 may be used to analyze data of the type shown in FIG. 5 so as to identify a signal transition-based ratio coefficient defining the relation between a signal transition time and a resistive-capacitive delay.

The delay calculation module 42 then uses the signal transition-based ratio coefficient to calculate the Elmore delay, using the known Elmore delay equations described above. In other words, at this juncture, a maximum delay can be defined based upon the signal transition-based ratio coefficient.

Thus, the technique of the invention modifies prior art Elmore delay values used in repeater insertion techniques by establishing an Elmore delay value based upon a transition time value incorporated into the ratio coefficient. This results in more accurate information, allowing for a more accurate placement of repeaters. Prior art techniques do not consider transition time information, instead, minimum delays are used, resulting in excessive repeaters.

The transition-based Elmore delay value identified in accordance with the invention is then applied to the repeater insertion module 44. The repeater insertion module 44 may operate on a Standard Parasitic Format (SPF) output provided by an RC extraction tool. SPF is a way to represent RC data and it is compatible with the SPICE format. Block timing models are also needed to provide driver and load information.

Figure 6:
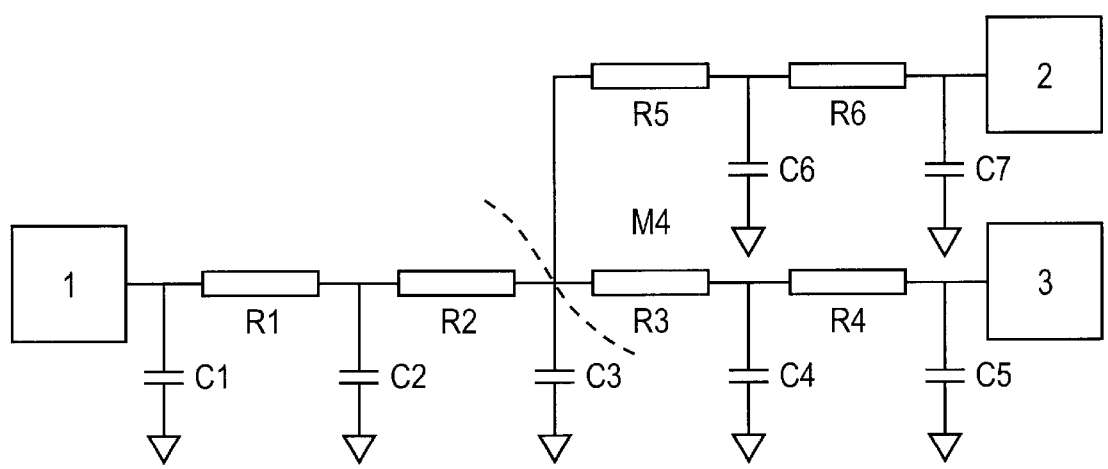
FIG. 6 illustrates a sample circuit into which a repeater is inserted in accordance with an embodiment of the invention.
Figure 7:
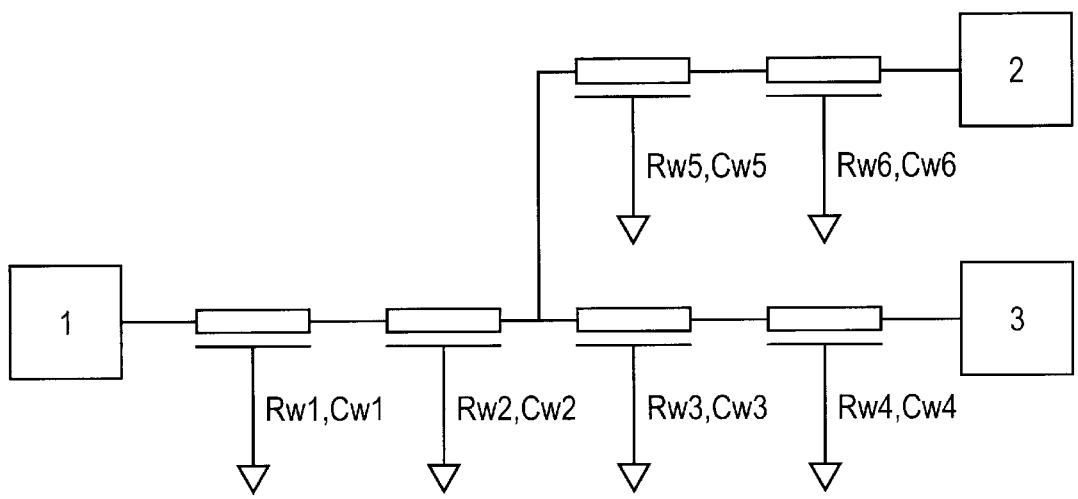
FIG. 7 illustrates a circuit that is electrically equivalent to the circuit of FIG. 6.

In SPF data, the RC nets are represented as lumped RC models, as shown, for example, in FIG. 6. In order to insert repeaters, the lumped RC model is transformed into a distributed model. A resistor and capacitor is associated with each node in the lump RC model. In the distributed model, each wire segment is associated with a resistance and a distributed capacitance. The distributed capacitance for a wire segment can be obtained by multiplying the capacitance of each node with the ratio of the segment resistance to the sum of all resistances attached to the node. The resistance is similar for both lumped and distributed models. This transformation is shown in FIG. 7.

Figure 8:
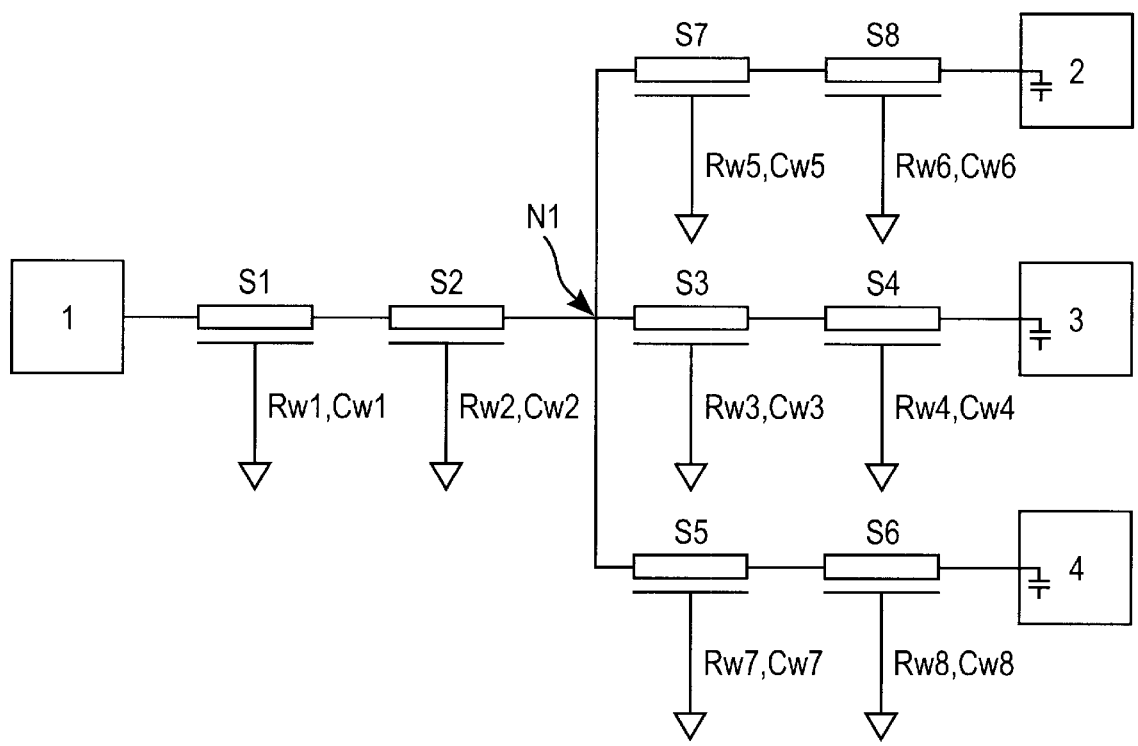
FIG. 8 illustrates a distributed impedance model of a circuit processed in accordance with an embodiment of the invention.

FIG. 8 illustrates a distributed impedance model of an interconnect with one driver (block 1) and three loads (blocks 2, 3, 4). The information for driver and loads is gathered from the timing models associated with these blocks. Rwx and Cwx are the distributed resistance and capacitance values for the corresponding segments.

Figure 9:
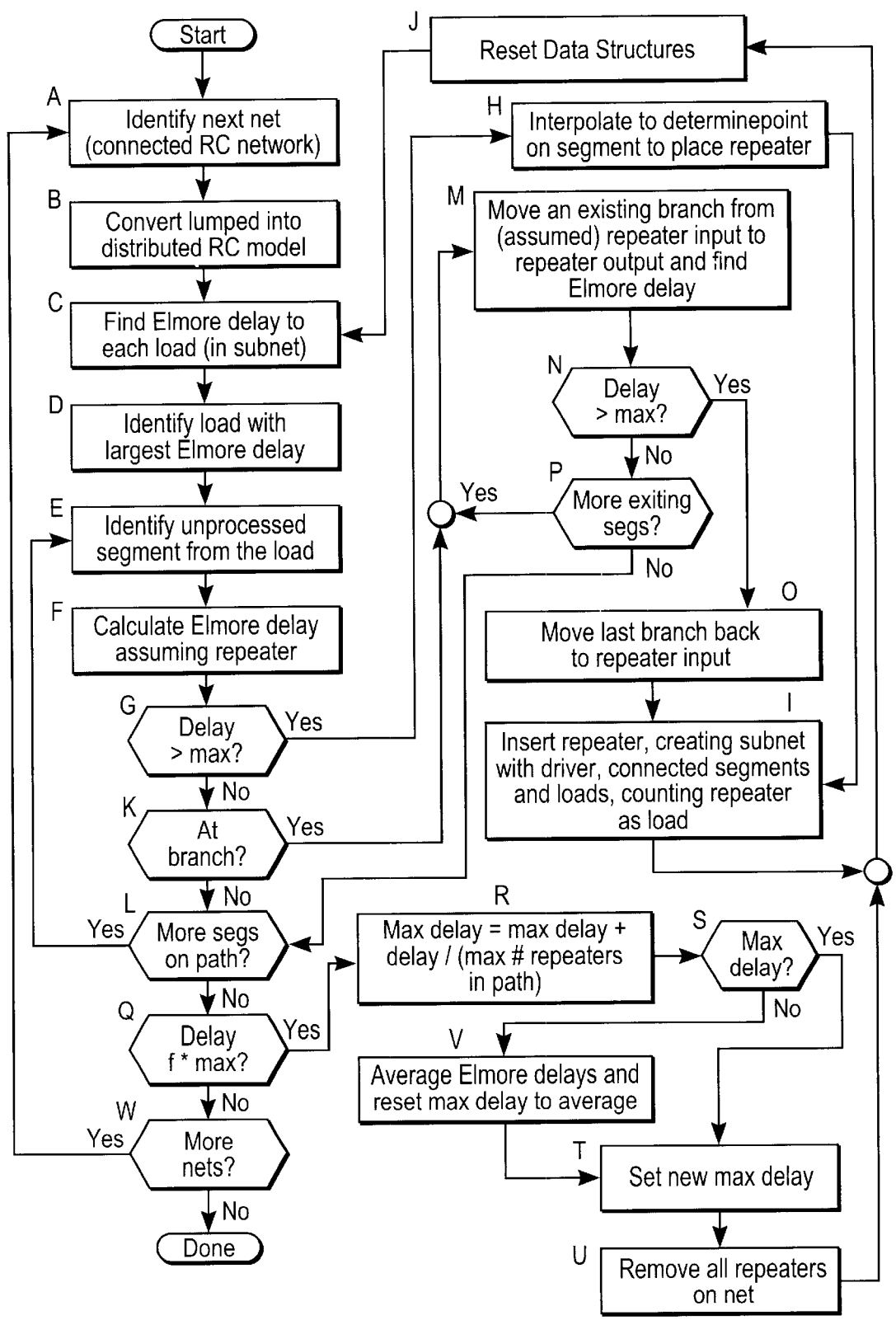
FIG. 9 illustrates a prior art repeater insertion methodology that may be used in connection with the present invention.

FIG. 9 illustrates a repeater placement technique that may be used in accordance with an embodiment of the invention. This prior art technique is described in a pending patent application entitled, "Repeater Insert for VLSI Circuits Using Distributed Impedance Model", Ser. No. 08/880,630, which is owned by the assignee of the present invention, and which is expressly incorporated by reference herein. For completeness, the repeater insertion method is briefly described herein.

Once the distributed capacitance has been calculated (Step B), the Elmore delay to each of the loads in the net from the driver is calculated (Step C). This step utilizes the transition-based Elmore delay identified above. The load with the largest delay is then determined (Step D). The repeaters are inserted starting from the load with the highest Elmore delay towards the driver.

Assuming load 2 as the one with the highest delay and proceeding backwards towards the driver, segment by segment (Step E), the delay is calculated for segment S8 considering a repeater as a driver (Step F). Then, the delay is compared to the maximum delay calculated earlier (Step G). If the delay exceeds the maximum, a repeater needs to be inserted. Interpolation is done to determine where along the segment to place the repeater so that the delay from the repeater to the load will be at the maximum delay (Step H).

The repeater is then inserted, creating a sub-net with the driver, connected segments and loads, and counting the repeater as a load (Step I). If, after the first segment S8 calculation, the delay did not exceed the maximum, a next segment is added to the analysis considering a driver at the beginning of the segment (S7). The Elmore delay is calculated again from the assumed driver to the load 2.

While parsing through segments, every node will be checked to determine whether a branch point is present (Step K). In case the above step is true, "a branch point is present", an existing branch is moved from an assumed repeater input to a repeater output, and the Elmore Delay at the load is then determined (Step M). In the example shown in FIG. 8, there is a branch point at node N1. Accordingly, if that is the case, the delay is calculated considering only one branch (N1→S7→S8) exiting node N1, and the assumed repeater with the input at node N1. If the delay for that branch is less than the maximum value set (Step N), and there are more exiting branches (Step P), the next branch from the branch point is then added (N1→S3→S4) and the delay is again examined.

Figure 10:
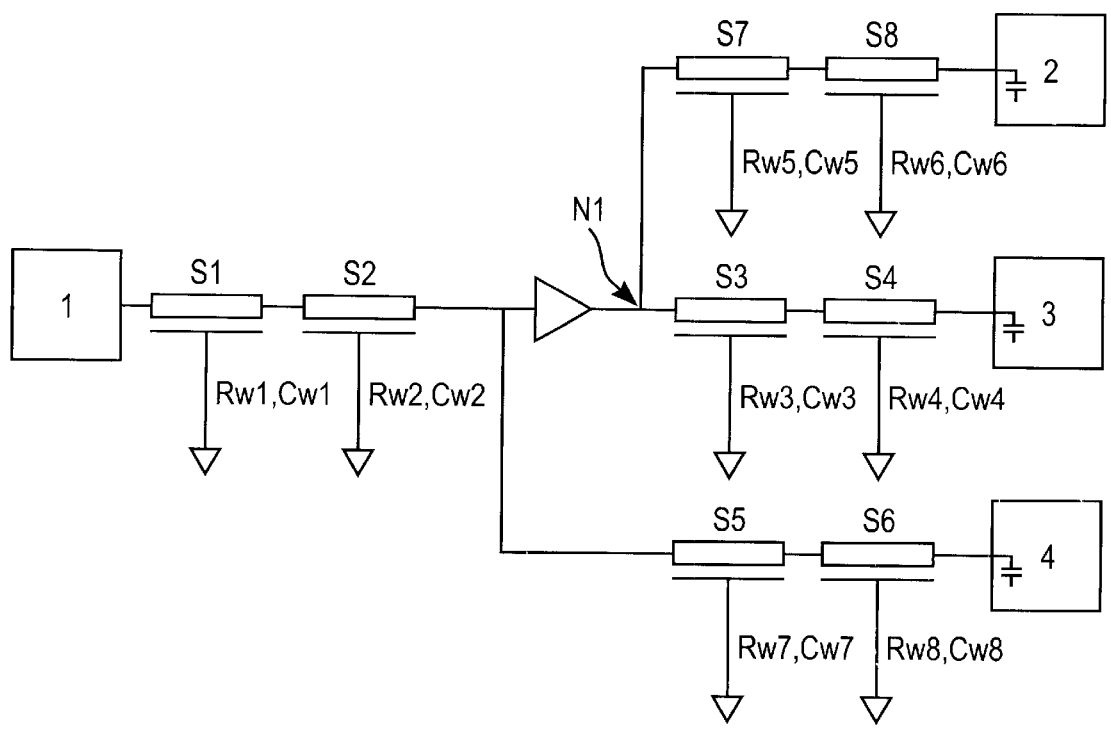
FIG. 10 illustrates the positioning of a repeater into the circuit of FIG. 8 in accordance with an embodiment of the invention.

If the delay still does not exceed the maximum, yet another branch, if present, may be added, such as N1→S5→S6. At this point, if the maximum delay is exceeded, a repeater is inserted with its output connected to only the branches which were added before the maximum was exceeded (N1→S7→S8, N1→S3→S4). The last branch added to exceed the maximum delay, and any remaining branches, are then connected before the repeater (Steps O and I). In this case, this results in the branch N1→S5→S6, as shown in FIG. 10.

Once all segments in a net have been calculated, the delay to the first repeater is then examined. If a delay less than the maximum delay (less than some number f times the maximum delay) results to this first repeater (Step Q), it may be that (a) if the delay is small enough, the last repeater can be eliminated and all the repeaters shifted towards the driver, or (b) all the repeaters can be shifted towards the loads, to equalize the delays between them. This can be done without changing the number of repeaters.

One method of eliminating a repeater is to set a new maximum delay that is not higher than the initial maximum delay plus some error margin. This can be accomplished by setting the new maximum delay to be equal to the old maximum delay plus the delay to the first repeater divided by the total number of repeaters in the path, assuming the first repeater is eliminated (Step R). If this new maximum delay is acceptable (Step S), it is set as the new maximum delay (Step T), all repeaters on that net are moved (Step U), and the data structures are reset (Step J) and the process is started over for that net with the new maximum.

If the new delay is not acceptable (Step V), the Elmore delays are averaged to reset the maximum delay to the average. This will not reduce the number of repeaters, but will average out the delay between them. The new maximum is then used, with all repeaters being removed, and the data structure reset and the process repeated to determine the new placement for the repeaters. This will result in the repeaters being shifted such that the repeater placement results in a more equalized delay between the driver and the first repeater, between each of the repeaters, and between the last repeaters and the loads. Once the repeater placement for a particular net, or interconnect line has been completed, the next net is then examined with the process repeating Step W.

As indicated above, a SPICE RC model having nodes with physical locations (X, Y coordinates) can be obtained by extraction tools providing standard parasitic format data. This can then be used with the results of the above algorithm for repeater placement to determine the exact physical location desired for each repeater. This can be done by calculating the X, Y coordinates for the point at which the repeater is to be inserted along a segment extending between two nodes with coordinates given.

Depending upon a particular physical implementation, repeater placement exactly at those coordinates may not be possible. Accordingly, it is commonly necessary to determine a closest location for a repeater in a block (control block or datapath). The interconnect line can then be re-routed to go to this block and back, as shown with lines 126 and 128 in FIG. 11. This additional path introduces some additional delay. An optimum way for handling this is to simply, when determining the original maximum delay, build in a margin of error sufficient to cover the maximum amount for extra lines of this type. Alternatively, the delay could be re-calculated using the new line lengths added.

Figure 11:
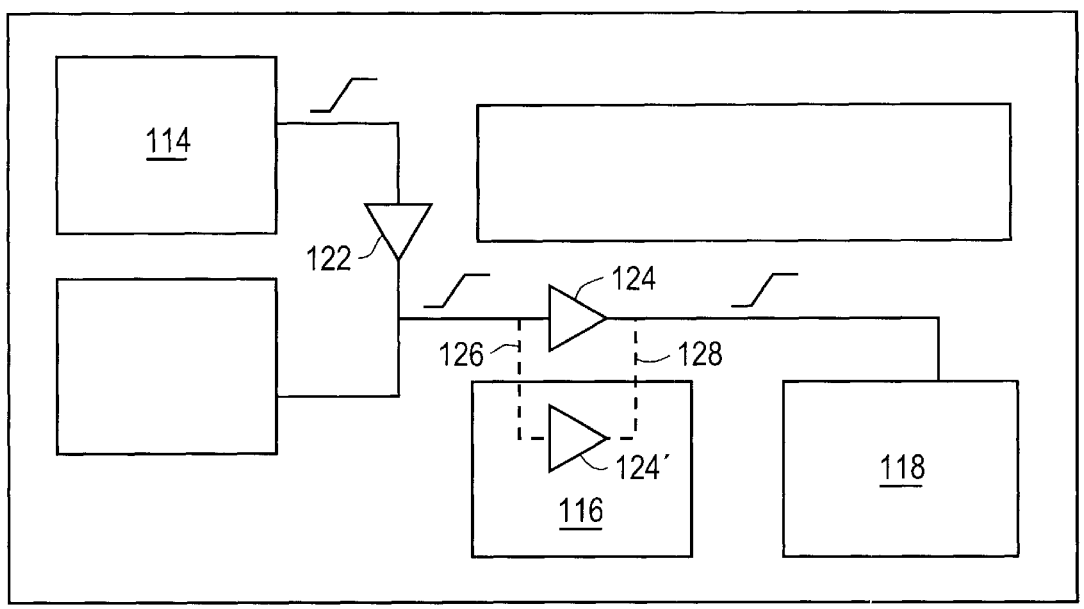
FIG. 11 illustrates alternate locations at which a repeater may be positioned in accordance with the invention.

FIG. 11 is a simplified illustration of a VLSI chip, such as a microprocessor. The figure shows a number of circuit blocks, such as 114, 116, and 118 and a typical net connected to these blocks. In order to reduce the delay caused by driving a long line with significant loading, repeaters are inserted, as illustrated by repeaters 122 and 124. The repeater can either by physically placed in the datapath, or there may need to be detour lines provided to the nearest available logic that can perform the repeater function. For example, instead of repeater 24, a repeater 24' in block 116 may be used, with additional interconnect lines 126 and 128 being required. These additional interconnect lines and their delay need to be figured into any determination of repeater placement, or enough margin for error needs to be included to accommodate this extra distance.

Executing the foregoing technique on SPF data with node coordinates places the repeaters at optimal locations from a timing point of view. However, since placing repeaters at these locations is not always physically possible, it is common to group repeaters where space is available. The remaining repeaters can be placed in the vicinity of blocks of logic, as discussed in connection with FIG. 11.

After the repeaters are placed, the circuit is typically re-routed with the routing tool 46. Timing and distance constraints can be put on certain nets to enforce optimum routing. The performance of the circuit may then be tested with the timing verifier 48. Several iterations through the following steps may be required: full chip RTL, routing, RC extraction, and full chip timing analysis (mainly identifying the critical paths and long wires) until a satisfactory result is obtained in terms of area, power, and timing.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

In the claims:

1. A method of inserting repeaters into a complex integrated circuit, said method comprising the steps of:

selecting, based upon signal transition data, a maximum wire length to be positioned between two repeaters in a complex integrated circuit;

correlating said maximum wire length with a signal transition-based ratio coefficient defining the relation between a signal transition time and a Resistive-Capacitive delay;

defining a signal transition-based Resistive-Capacitive delay based upon said signal transition-based ratio coefficient; and mapping a repeater distribution within said complex integrated circuit based upon said signal transition-based Resistive-Capacitive delay.

2. The method of claim 1 wherein said selecting step includes the steps of:

identifying proposed wire lengths based upon defined relationships between wire lengths and signal propagation delays;

analyzing signal transition data for signals on said proposed wire lengths; and choosing said maximum wire length based upon said analyzing step.

3. The method of claim 1 wherein said correlating step includes the steps of:

securing circuit simulation data defining the relation between wire length and signal transition-based ratio coefficients; and choosing said signal transition-based Resistive-Capacitive ratio coefficient from said circuit simulation data.

4. The method of claim 1 further comprising the step of determining, prior to said selecting step, a repeater size and wire parameters for said complex integrated circuit in view of preselected design requirements.

5. The method of claim 4 where said determining step includes the step of using preselected design requirements selected from the group including: propagation delay, wire width, and power dissipation.

6. The method of claim 1 wherein said mapping step includes the step of mapping repeaters within said complex integrated circuit such that substantially equal transition times are maintained at the input of each gate within said complex integrated circuit.

7. A computer readable memory to direct a computer to function in a specified manner, comprising:

a wire length identification module to select, based upon signal transition data, a maximum wire length to be positioned between two repeaters in a complex integrated circuit;

a ratio coefficient selection module to correlate said maximum wire length with a signal transition-based ratio coefficient defining the relation between a signal transition time and a Resistive-Capacitive delay;

a delay calculation module to define a signal transition-based Resistive-Capacitive delay based upon said signal transition-based ratio coefficient; and a repeater insertion module to map a repeater distribution within said complex integrated circuit based upon said signal transition-based Resistive-Capacitive delay.

8. The apparatus of claim 7 wherein said wire length identification module includes executable instructions to:

identify proposed wire lengths based upon defined relationships between wire lengths and signal propagation delays;

analyze signal transition data for signals on said proposed wire lengths; and choose said maximum wire length based upon said signal transition data.

9. The apparatus of claim 7 wherein said ratio coefficient selection module includes executable instructions to:

securing circuit simulation data defining the relation between wire length and signal transition-based ratio coefficients; and choose said signal transition-based Resistive-Capacitive ratio coefficient from said circuit simulation data.

10. The apparatus of claim 1 further comprising a repeater selection module to determine a repeater size for said complex integrated circuit in view of preselected design requirements.

11. The apparatus of claim 10 where said repeater selection module determines said repeater size based upon preselected design requirements selected from the group including: propagation delay, wire width, and power dissipation.

12. The apparatus of claim 7 wherein said repeater insertion module maps repeaters within said complex integrated circuit such that substantially equal transition times are maintained at the input of each gate within said complex integrated circuit.

* * * * *